(12) United States Patent
Moda

(10) Patent No.: US 9,905,536 B2
(45) Date of Patent: Feb. 27, 2018

(54) SEMICONDUCTOR DEVICE

(71) Applicant: J-DEVICES CORPORATION, Oita (JP)

(72) Inventor: Makoto Moda, Oita (JP)

(73) Assignee: J-DEVICES CORPORATION, Oita (JP)

( * ) Notice: Subject to any disclaimer, the term of this patent is extended or adjusted under 35 U.S.C. 154(b) by 17 days.

(21) Appl. No.: 14/994,963

(22) Filed: Jan. 13, 2016

(65) Prior Publication Data

US 2016/0218086 A1    Jul. 28, 2016

(30) Foreign Application Priority Data

Jan. 26, 2015   (JP) ................. 2015-012379

(51) Int. Cl.
*H01L 25/065* (2006.01)
*H01L 23/36* (2006.01)
(Continued)

(52) U.S. Cl.
CPC .......... *H01L 25/0657* (2013.01); *H01L 23/36* (2013.01); *H01L 23/49861* (2013.01); *H01L 24/48* (2013.01); *H01L 24/73* (2013.01); *H01L 24/83* (2013.01); *H01L 29/0657* (2013.01); *H01L 24/29* (2013.01); *H01L 24/32* (2013.01); *H01L 24/33* (2013.01); *H01L 24/49* (2013.01); *H01L 2224/26145* (2013.01); *H01L 2224/2919* (2013.01); *H01L 2224/2939* (2013.01); *H01L 2224/29294* (2013.01); *H01L 2224/29339* (2013.01); *H01L 2224/32145* (2013.01); *H01L 2224/32225* (2013.01); *H01L 2224/33181* (2013.01); *H01L 2224/45144* (2013.01); *H01L 2224/45147* (2013.01); *H01L 2224/48227* (2013.01); *H01L 2224/49113* (2013.01); *H01L 2224/49173* (2013.01); *H01L 2224/73215* (2013.01); *H01L 2224/73265* (2013.01); *H01L 2224/83101* (2013.01); *H01L 2224/83365* (2013.01); *H01L 2225/06555* (2013.01);
(Continued)

(58) Field of Classification Search
CPC . H01L 25/0657; H01L 25/074; H01L 25/117; H01L 23/3675; H01L 24/32; H01L 21/8221; H01L 24/48; H01L 24/73; H01L 24/29; H01L 24/33; H01L 24/49; H01L 29/0657; H01L 2224/26145; H01L 2224/48227; H01L 2224/49113; H01L 2225/06555
See application file for complete search history.

(56) References Cited

U.S. PATENT DOCUMENTS 5,804,004 A * 9/1998 Tuckerman ............. H01L 24/78
156/300
6,759,745 B2 * 7/2004 Masumoto .......... H01L 21/6835
257/730
(Continued)

FOREIGN PATENT DOCUMENTS

JP    2014-103198 A    6/2014

*Primary Examiner* — Joseph C Nicely
(74) *Attorney, Agent, or Firm* — Hauptman Ham, LLP

(57) ABSTRACT

A semiconductor device is provided including a package substrate, and a plurality of semiconductor chips stacked above the package substrate, at least one of the plurality of semiconductor chips including a step part in a periphery edge part of a rear surface.

8 Claims, 8 Drawing Sheets

(51) Int. Cl.
  *H01L 23/498*  (2006.01)
  *H01L 29/06*  (2006.01)
  *H01L 23/00*  (2006.01)

(52) U.S. Cl.
  CPC ............... *H01L 2225/06589* (2013.01); *H01L 2924/10158* (2013.01)

(56) References Cited

U.S. PATENT DOCUMENTS

| | | | | |
|---|---|---|---|---|
| 7,064,006 B2* | 6/2006 | Akram | ................ | H01L 23/3185 257/E25.011 |
| 2001/0034082 A1* | 10/2001 | Urushima | ............. | H01L 21/563 438/118 |
| 2002/0096754 A1* | 7/2002 | Chen | ........................ | H01L 24/33 257/686 |
| 2004/0080041 A1* | 4/2004 | Kimura | ................... | H01L 23/36 257/706 |
| 2004/0245652 A1* | 12/2004 | Ogata | ..................... | H01L 24/03 257/777 |
| 2006/0084254 A1* | 4/2006 | Attarwala | ........... | H01L 21/4857 438/584 |
| 2006/0175697 A1* | 8/2006 | Kurosawa | ............ | H01L 21/6836 257/686 |
| 2007/0190691 A1* | 8/2007 | Humpston | .......... | B81C 1/00269 438/113 |
| 2008/0277793 A1* | 11/2008 | Noma | ................. | H01L 21/6835 257/758 |
| 2009/0026592 A1* | 1/2009 | Kwang | ............. | H01L 23/49503 257/676 |
| 2010/0052149 A1* | 3/2010 | Nose | ................. | H01L 23/49503 257/692 |
| 2010/0244268 A1* | 9/2010 | Tang | ....................... | H01L 24/24 257/773 |
| 2011/0215438 A1* | 9/2011 | Kwang | ................... | H01L 24/83 257/531 |
| 2013/0020720 A1* | 1/2013 | Kim | ..................... | H01L 23/3135 257/774 |
| 2014/0138852 A1 | 5/2014 | Suda | | |
| 2014/0319663 A1* | 10/2014 | Shibasaki | ........... | H01L 21/4828 257/670 |
| 2016/0029491 A1* | 1/2016 | Tomohiro | ............ | H01L 25/105 361/767 |

* cited by examiner 105  106  104  101  108

105  106  104  101  108

SEMICONDUCTOR DEVICE

CROSS REFERENCE TO RELATED APPLICATIONS

This application is based upon and claims the benefit of priority from the prior Japanese Patent Application No. 2015-012379, filed on Jan. 26, 2015, the contents of which are incorporated herein by reference.

FIELD

The present invention is related to a semiconductor device. One embodiment of the disclosed invention is related to a semiconductor device in which a plurality of semiconductor chips is stacked within a package.

BACKGROUND

A semiconductor device is formed by cutting a plurality of semiconductor chips arranged in a matrix shape above a single silicon wafer using dicing and sealing the chips by packaging.

In a conventional semiconductor chip, a method of adhering a lower side device with the upper side device using a spacer or a method of misaligning the center of a chip adhered to an upper side from the center of a chip on the lower side are adopted when an electrical connection terminal arranged on the surface of the chip is connected using bonding wire etc in the case where for example the same chips are stacked using a die attach film in order to void connecting a chip adhered below.

In addition, there is a problem whereby a paste material which protrudes from an adhesion part of a pair of chips tends to creep up the side surface of a chip in the case of a package using a die attach paste, the creeping paste material reaches the top surface of the chip which degrades the quality of the semiconductor device.

For example, in a semiconductor device having a CoC (chip on chip) connection structure, when an underfill resin dripper between an upper side semiconductor chip and lower side conductor chip flows above an electrical connection terminal arranged on the surface of the lower side semiconductor chip, an electrical contact between the electrical connection terminal and bonding wire etc may be blocked. To deal with such a problem, a technique has been disclosed in Japanese Laid Open Patent No. 2014-103198 for example in which a dam pattern is arranged so as to enclose the electrical connection terminal.

SUMMARY

According to one embodiment of the present invention, a semiconductor device is provided including a package substrate, and a plurality of semiconductor chips stacked above the package substrate, at least one of the plurality of semiconductor chips including a step part in a periphery edge part of a rear surface.

According to one embodiment of the present invention, a semiconductor device is provided including a package substrate, and a first semiconductor chip including a plurality of grooves on a rear surface and including a step part on an end part of the rear surface, the rear surface of the first semiconductor chip and the package substrate being adhered by an adhesive.

DESCRIPTION OF EMBODIMENTS

The embodiments of the present invention are explained below while referring to the diagrams. However, the present invention can be carried out using many different variations and should not be interpreted as being limited to the contents described in the embodiments exemplified below. In addition, although the width, thickness and shape etc of each component are represented schematically compare to the actual components in order to clarify the explanation, these are merely examples are should not limit an interpretation of the present invention. Furthermore, the same reference symbols are attached to the same or similar elements that have already appeared previously in the specification and each diagram and an explanation of such elements may be omitted as appropriate.

In the present specification, when certain components or regions are described as [above (or below)] other components or regions, unless specified otherwise, this includes not only being directly above [or directly below] other components or regions, but also above [or below] other components or regions, that is, other structural components may be included therebetween.

According to the conventional methods, the surface area taken up by a chip increases seen from a planar view and becomes higher seen from a cross-sectional view with an increase in the number of stacked semiconductor chips leads to the problem of an increase in costs due to the application of a spacer and the like at the same time as preventing smaller scale and thinner packaging.

In addition, in the case where a package requires heat dissipation, although there are generally used methods such a method for adhering a heat sink to an upper part of a semiconductor chip with a flip structure to reduce heat resistance for example, and a method for reducing heat resistance of a material applied to a semiconductor package by combining a sealing resin with heat dissipation specifications, there are limits to reducing heat resistance while maintaining the required characteristics of a material.

In order to overcome these problems, one aim of an embodiment of the present invention is to provide a small scale and thin semiconductor device. In addition, one embodiment of the present invention aims to improve the quality of a semiconductor device.

First Embodiment

Figure 1A:
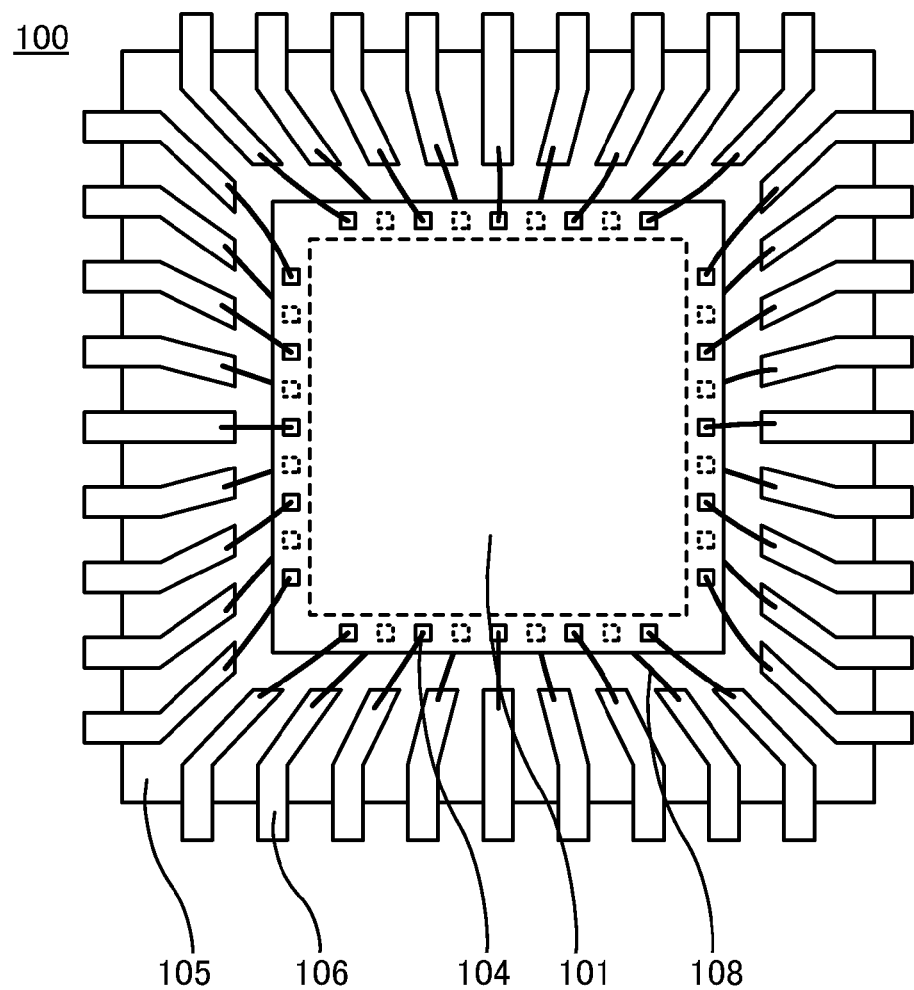
FIG. 1A is an upper surface diagram showing a schematic structure of a semiconductor device related to one embodiment of the present invention.
Figure 1B:
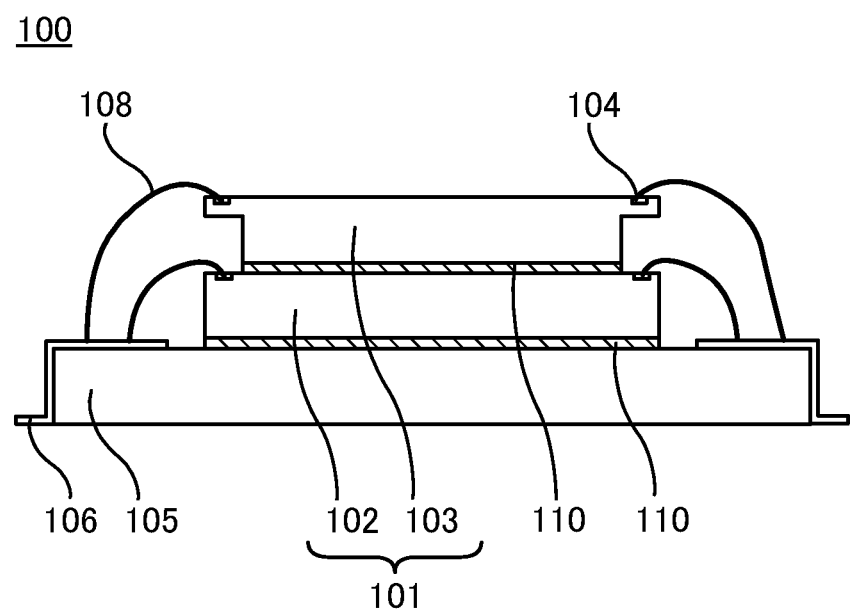
FIG. 1B is a cross-sectional diagram showing a schematic structure of a semiconductor device related to one embodiment of the present invention.

The structure of a semiconductor device 100 related to the present embodiment is explained while referring to FIG. 1A and FIG. 1B. FIG. 1A is a planar view diagram of the semiconductor device 100 related to the present embodiment. FIG. 1B is a cross-sectional diagram of a semiconductor chip 100 related to the present embodiment. The semiconductor device 100 includes a plurality of semiconductor chips 101 stacked above a package substrate 105. A plurality of electrical connection terminals 104 is arranged in each of the plurality of semiconductor chips 101. In addition, a terminal electrically connected with an electrical connection terminal 104 of the semiconductor chip 101 is arranged in the package substrate 105. Although the form of this terminal is arbitrary, for example the terminal may be a plurality of lead frames 106 as is shown in FIG. 1A. A bonding wire 108 is used in the connection between the electrical connection terminal 104 and lead frame 106. As is shown in the cross-sectional diagram of FIG. 1B, the size of the stacked plurality of semiconductor chips 101 is roughly the same. Furthermore, although the form of the semiconductor chip 101 exemplified in FIG. 1B is shown as stacked, the plurality of semiconductor chips 101 is not limited to two layers and the semiconductor device 100 according to the present embodiment may also be expanded to three or more layers.

The plurality of semiconductor chips 101 may be cut from a silicon wafer. At this time, the silicon wafer may be a bulk silicon wafer or a SOI (Silicon on Insulator) water. Alternatively, the plurality of semiconductor chips 101 may be cut from other semiconductor wafers. Each of the plurality of semiconductor chips 101 are formed with a semiconductor integrated circuit on the surface not shown in the diagrams. Furthermore, the electrical connection terminal 104 is arranged in the vicinity of an end part of the surface. The plurality of semiconductor chips 101 are adhered and stacked using and adhesive 110. A bonding film is used as the adhesive 110 and a die attach film for example is used. Furthermore, in the present specification, a surface on the side on which a semiconductor integrated circuit of the semiconductor chip 101 is formed is called [upper surface] and the opposite side surface is called [rear surface].

The present embodiment includes processing a rear surface of the plurality of semiconductor chips 101. Specifically, as is shown in FIG. 1B, an end part of the rear surface an upper layer semiconductor chip 103 is shaped so become thinner compared to the other part. In other words, the semiconductor chip 101 includes a step part in a periphery edge part of the rear surface and the thickness becomes thinner on the exterior side of the step part and thicker on the interior side. The step part arranged in an upper layer semiconductor chip 103 is located further to the interior than a region arranged with an electrical connection terminal 104 of a semiconductor chip 102 arranged on a lower layer. By providing this step part, the upper layer semiconductor chip 103 does not contact with a lower layer semiconductor chip 102 at an end part, and an inner region of the step part in planar view becomes adhesion surface with a lower layer semiconductor chip 102. That is, the adhesion surface with the lower layer semiconductor chip 102 becomes smaller than the upper surface area of the semiconductor chip 102. An end part of an adhesion surface of a lower layer semiconductor chip 102 and upper layer semiconductor chip 103 is shown by a dashed line in FIG. 1A.

In the lower layer semiconductor chip 102, a clearance is formed on the exterior side of an adhesion surface with the upper layer semiconductor chip 103 which exposes an electrical connection terminal 104. In addition, by forming this clearance, it is possible to connect the electrical connection terminal 104 using a bonding wire 108 and the like.

It is possible to arrange a step part arranged in the upper layer semiconductor chip 103 by processing from the rear surface side of the chip. For example, it is possible to form the step part by selectively cutting the rear surface of the semiconductor chip 103 and etching. The processing depth when forming the step part may be a depth that does not affect devices formed on the upper surface side. The shape of the step part formed by this type of processing, for example, can be a taper shape or taper shape having curvature. If a step difference in the step shape is adopted, it is possible to increase the size of the clearance for connecting the bonding wire 108. In addition, if the step part has a taper shape, it is possible to connect the bonding wire 108 to the lower layer semiconductor chip 102, and improve mechanical strength of the region arranged with the periphery edge part of the upper layer semiconductor chip 103, that is, the electrical connection terminal 104.

With respect to the processing depth when forming a step from the rear surface side of the semiconductor chip 101, since a region that does not contribute to adhesion of the semiconductor chip 101 which is thinned by the thickness and step from the rear surface of the semiconductor chip 101 to the deepest part of the step is required to have mechanical strength that can withstand stress during bonding wire 108 connection or the stress during packaging, it is preferred to be as small as possible. On the other hand, the thickness from the deepest part of the step up to the chip upper surface is preferably as large as possible. However, a combination of these dimensions is determined while performing a reliability test in order to maintain the quality of the semiconductor device 100.

According to the semiconductor device 100 related to the present embodiment, because it is possible to avoid interference with the bonding wire 108 connected to the semiconductor chip 102 adhered to the lower side using the step part formed on the periphery edge part of the semiconductor chip 101, it is not necessary to misalign the center of the semiconductor chip 103 arranged on an upper layer from the center of the lower layer semiconductor chip 102. That is, it is possible to match and stack the centers of the plurality of semiconductor chips 101 of the same or similar size so that they do not interfere with size reduction because there is no increase in area occupied by the plurality of semiconductor chips 101 due to stacking. In other words, it is possible to stack a plurality of semiconductor chips 101 while making the area of a region where the semiconductor integrated circuit is formed in a semiconductor chip 101 the same, and it is possible to make a connection using a bonding wire 108 with semiconductor chips 101. In this case, since it is possible to stack the centers of a plurality of semiconductor chips almost in alignment, it is not necessary to increase the size of the package substrate. As a result, it is possible to reduce the size of the semiconductor device according to the present embodiment.

Furthermore, as described below, in the case where a paste type adhesive such as die attachment paste is used as the adhesive 110, although there is a danger of the adhesive protruding to the outside of the adhesion part and creeping up to the upper surface of the upper layer substrate leading to a deterioration in quality of the semiconductor device, it is possible to avoid this by providing the step part.

The center of the semiconductor chip 101 means the intersection of a diagonal line if the semiconductor chip 101 is rectangular for example. According to the present embodiment, the center position of the plurality of semiconductor chips 101 approximately match in planar view and it is possible to arrange them in a region of a circle with a radius of about 0.005 mm.

Furthermore, although a form of arranging the step part only on the upper side semiconductor chip 103 is shown in FIGS. 1A and 1B, the step part may also be arranged provided on the lower side. In this case, it is possible to avoid the adhesive creeping up in the case of adhering the package substrate 105 and the semiconductor chip 102 using a paste shape adhesive.

According to the semiconductor device 100 related to the present embodiment, since it possible to avoid interference between the bonding wire and the upper side semiconductor chip 103 due to the step difference arranged at the end part of the semiconductor chip 101 and the clearance due to the step difference, it is possible to perform adhesion using the adhesive 110 without the need for a spacer or spacer film. As a result, according to the present embodiment, it is possible to provide the semiconductor device 100 at low cost without hindering small scale of the semiconductor device 100.

Although the material of the bonding wire 108 is preferred to have excellent electrical conductivity such as gold wire or copper wire, any material is possible if the material has the necessary electrical conductivity and connectivity.

Modified Example 1-1

Figure 2A:
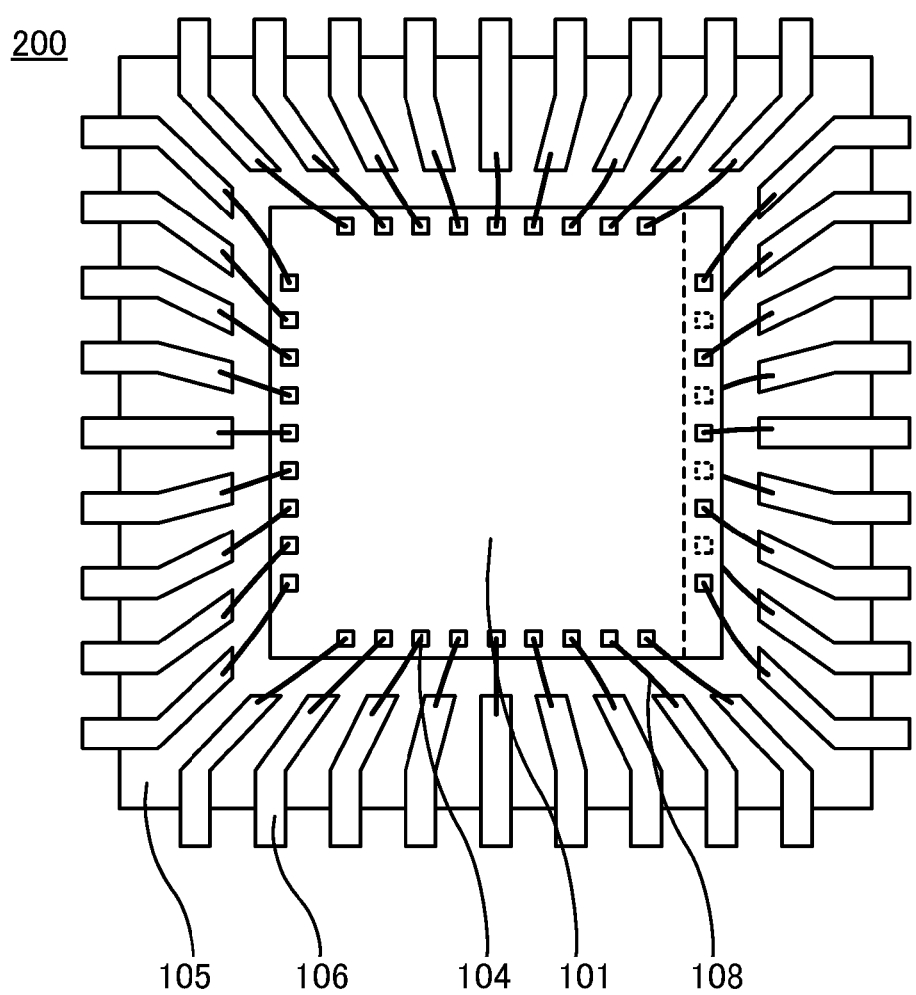
FIG. 2A is an upper surface diagram showing a schematic structure of a semiconductor device related to one embodiment of the present invention.
Figure 2B:
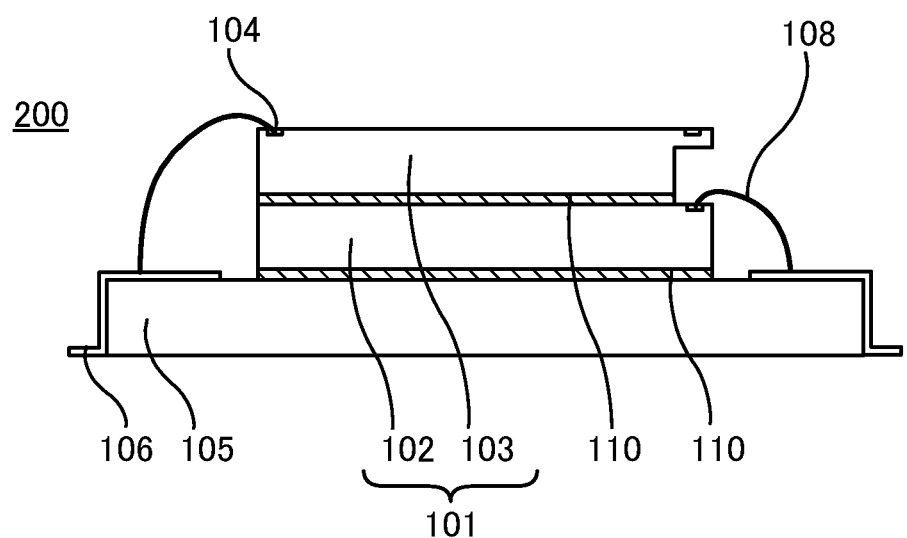
FIG. 2B is a cross-sectional diagram showing a schematic structure of a semiconductor device related to one embodiment of the present invention.

The structure of a semiconductor device 200 related to the present modified example is explained while referring to FIGS. 2A and 2B, FIG. 2A is a planar view of the semiconductor device 200 related to the present modified example. FIG. 2B is a cross-sectional view of the semiconductor device 200 related to the present modified example. Compared to the semiconductor device 100 described above, the semiconductor device 200 related to the present modified example is different only in the arrangement of the step part of the upper layer semiconductor chip 103. In the semiconductor device 100 described above, although the step part is arranged at the end part of the entire outer periphery region of the upper layer semiconductor chip 103, the present structure is not limited to this, the step part may also be arranged only on one side of the periphery edge part within the periphery edge part as in the present modified example. In addition, the step part may also be arranged on any two sides or three sides.

Second Embodiment

Figure 3A:
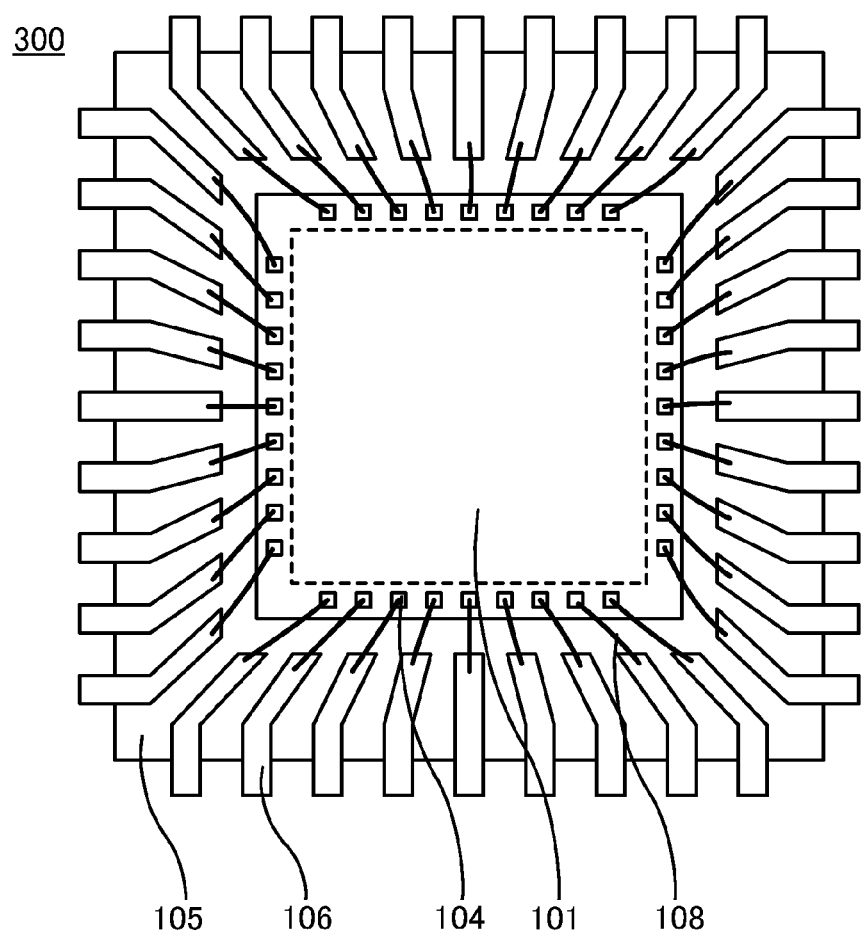
FIG. 3A is an upper surface diagram showing a schematic structure of a semiconductor device related to one embodiment of the present invention.
Figure 3B:
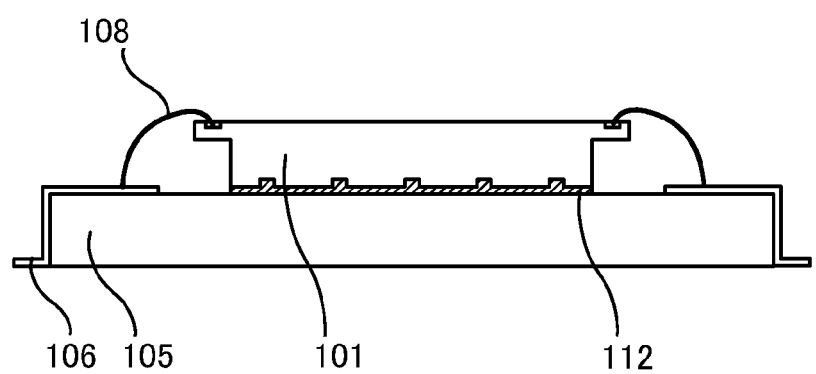
FIG. 3B is a cross-sectional diagram showing a schematic structure of a semiconductor device related to one embodiment of the present invention.

The structure of a semiconductor device 300 related to the present embodiment is explained while referring to FIGS. 3A and 3B. FIG. 3A is a planar view of the semiconductor device 300 related to the present embodiment. FIG. 3B is a cross-sectional view of the semiconductor device 300 related to the present embodiment.

The semiconductor device 300 related to the present embodiment further includes a plurality of grooves on the rear surface of the semiconductor chip 101 in addition to having a step on the rear surface of the semiconductor chip 101. In addition, the semiconductor chip 101 having these grooves is adhered to the package substrate 105 using an adhesive 112. In the present embodiment, a paste like adhesive such as a die attach paste for example is used as the adhesive 112.

By arranging a groove on the rear surface of the semiconductor chip 101, surface area of the rear surface is increased. Due to this increase in the surface area of the rear surface, adhesion strength is improved due an increase in area covered by the adhesive 112 and the reliability of the semiconductor device 300 is improved.

The grooves formed on the rear surface of the semiconductor chip 101 may be formed by processing with a dicing blade when dicing for example and may be processed using a photolithography process. Since the adhesive 112 enters each of the plurality of grooves without any gaps and the entire surface of the grooves contributes to adhesion, it is possible to improve adhesive strength.

In addition, the adhesive 112 has characteristics to protrude from the join part of the plurality of semiconductor chips 101 and creep up the side surface of the semiconductor chip 101. In the case where a semiconductor device 300 uses the adhesive 112, the adhesive 112 which has crept up reaches the upper surface of the upper layer semiconductor chip 101 and in some cases this reduces the quality of the semiconductor device 300.

Since the semiconductor device 300 related to the present embodiment has a step part at an end part of the semiconductor chip 101, it is possible to suppress the adhesive 112 from protruding from the adhesion part between the semiconductor chip 101 and a lower layer and from creeping up to the upper surface of the semiconductor chip 101. That is, it is possible to avoid the problem of the adhesive 112 reaching the upper surface of the semiconductor chip 101, lowering the quality of the semiconductor device 300, and it is possible to provide a semiconductor device 300 with improved reliability.

It is preferred that the shape of the step in the present embodiment is a shape that can suppress as much as possible an adhesive 112 which adheres pairs of semiconductor chips 101 from creeping up an upper layer semiconductor chip 101. For this purpose, it is preferred that the distance from the end of the adhesion part to the upper surface of the upper layer side of semiconductor chip 101 is as long as possible. That is, for example, by adopting a step like shape, it is possible to secure a longer distance than a taper shape or taper shape with a curvature, and it is possible to effectively suppress adhesive 112 from creeping up.

It is possible to use a die attach paste for example as the paste type adhesive 112. And it is possible to use a silver based or resin based paste. However, the paste is not particularly limited.

Modified Example 2-1

Figure 4:
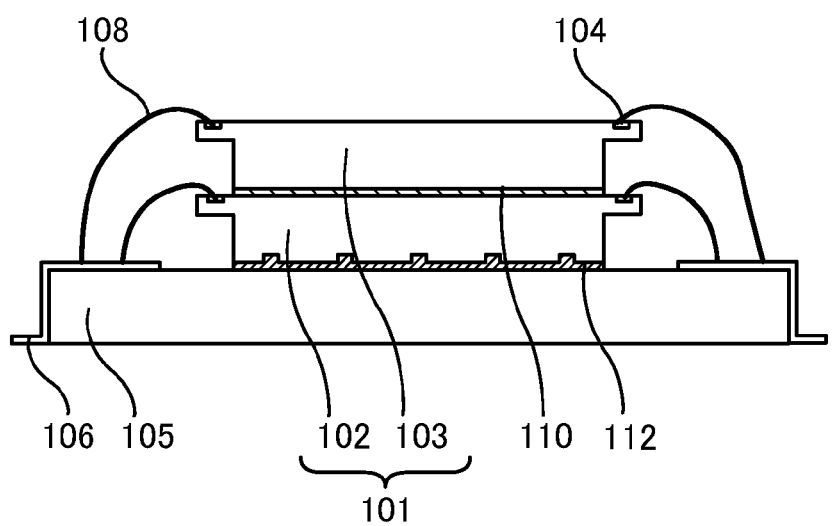
FIG. 4 is a cross-sectional diagram showing a schematic structure of a semiconductor device related to one embodiment of the present invention.

A structure of a semiconductor device 400 related to the present modified example is explained while referring to FIG. 4. FIG. 4 is a cross section of the semiconductor device 400 related to the present modified example. The semiconductor device 400 of the present modified example combines the semiconductor device 100 according to the first embodiment described above and the semiconductor device 300 according to the second embodiment. Specifically, a paste type adhesive 112 is used to adhere the package substrate 105 and the lower layer semiconductor chip 102, and a film type adhesive 110 is used to contact the lower layer semiconductor chip 102 and the upper layer semiconductor chip 103.

By adopting such a structure, it is sufficient to only arrange a step on the rear surface end part of an upper layer semiconductor chip 103 and it is not necessary to form grooves using a dicing process or photolithography process. Although the semiconductor chip 101 is exemplified as having two layers in the present modified example, in the case of three or more layers, it is possible to omit a step of forming a groove in the upper side semiconductor chip from the second layer.

Third Embodiment

Figure 5:
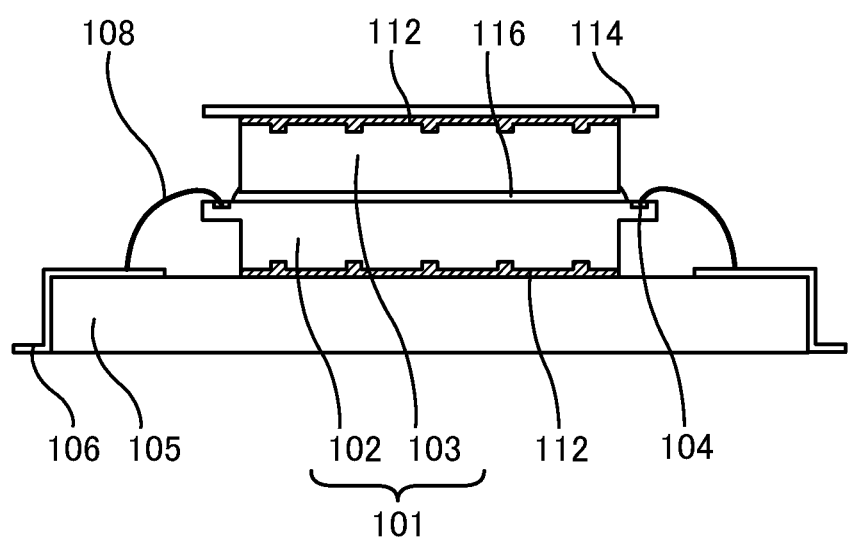
FIG. 5 is a cross-sectional diagram showing a schematic structure of a semiconductor device related to one embodiment of the present invention.

A structure of a semiconductor device 500 related to the present embodiment is explained while referring to FIG. 5. FIG. 5 is a cross-sectional view of the semiconductor device 500 related to the present embodiment. The semiconductor device 500 includes a semiconductor chip 102 arranged in contact with a package substrate 105, a semiconductor chip 103 arranged on an upper layer of the semiconductor chip 102, a heat sink 114 arranged above the semiconductor chip 103, an electrical connection terminal 104, a plurality of lead frames 106 arranged above the package substrate 105, and a bonding wire 108 which connects the electrical connection terminal 104 and lead frame 106. In the cross-sectional view of FIG. 5, although a two layer semiconductor chip 101 is exemplified as being stacked, the present embodiment is not limited to two layers. The semiconductor device 500 according to the present embodiment may be extended to three or more layers.

In the present embodiment, a plurality of grooves are formed in the rear surface of the lower layer semiconductor chip 102, and adhered to the package substrate 105 using a paste type adhesive 112. However, the present invention is not limited to this structure. A film type adhesive 110 may be used without forming a groove.

The upper layer semiconductor chip 103 has a flip structure. That is, the upper layer semiconductor chip 103 is arranged so that the upper surface formed with a semiconductor integrated circuit is positioned to face downward. A plurality of grooves is formed on the rear surface of the upper layer semiconductor chip 103. In addition, the rear surface of the upper layer semiconductor chip 103 and the heat sink 114 are adhered using an adhesive 116. It is possible to use an underfill agent, for example, as the adhesive 116.

By forming the grooves on the rear surface of the upper layer semiconductor chip 103, surface area of the rear surface is increased. Since the surface area of the rear surface of the semiconductor chip 103 is increased, it is possible to improve the heat dissipation effect by reducing the heat resistance.

The grooves formed on the rear surface of the semiconductor chip 103 may be formed by processing with a dicing blade during dicing for example and may be processed using a photolithography process.

The semiconductor devices 100 to 500 according to the preferred forms of the present invention were explained above. However, these are merely examples and the technical scope of the present invention should not be limited to these embodiments. A person ordinarily skilled in the art could carry out various modifications without departing from the gist of the present invention. Therefore, those modifications should also be interpreted as belonging to the technical scope of the present invention.

What is claimed is:

1. A semiconductor device comprising:
a package substrate; and
a plurality of semiconductor chips stacked above the package substrate, the plurality of semiconductor chips including a first semiconductor chip arranged on an upper layer among the plurality of semiconductor chips and second semiconductor chip arranged on a lower layer among the plurality of semiconductor chips,
wherein the first semiconductor chip includes a step part with a step difference in the step shape in a periphery edge part of a rear surface,
the step part exposes an electrical connection terminal of the second semiconductor chip,
the electrical connection terminal of the second semiconductor chip is arranged between adjacent electrical connection terminals of the first semiconductor chip in a top view toward the package substrate, and
a rear surface except the step part of the first semiconductor chip being adhered by an adhesive.

2. The semiconductor device according to claim 1, wherein the step part is arranged in one part of a periphery edge part of the first semiconductor chip.

3. The semiconductor device according to claim 2, wherein at least one of the plurality of semiconductor chips includes a plurality of grooves on a rear surface, and is connected with a lower layer via the adhesive.

4. The semiconductor device according to claim 2, wherein the step part is arranged in one side of the periphery edge part of the first semiconductor chip.

5. The semiconductor device according to claim 2, wherein the step part is arranged in each side of the periphery edge part of the first semiconductor chip.

6. The semiconductor device according to claim 2, wherein the surface of the step parts has electrical conductivity.

7. The semiconductor device according to claim 1, wherein each of the centers of the plurality of semiconductor chips roughly match and are arranged within a region having a radius within 0.005 mm.

8. The semiconductor device according to claim 7, wherein the adhesive is a die attachment paste.

* * * * *